United States Patent [19]

Razeghi et al.

[11] Patent Number: 4,897,699
[45] Date of Patent: Jan. 30, 1990

[54] GROUP III-V COMPOUND BASED OPTOELECTRONIC DEVICE ON SILICON SUBSTRATE

[75] Inventors: Manijeh Razeghi, Gif sur Yvette; Robert Blondeau, Ablis; Franck Omnes, les Ulis; Martin Defour, Courbevoie; Gérard Doriath, Verrieres le Buisson, all of France

[73] Assignee: Thomson-CSF, Paris, France

[21] Appl. No.: 247,390

[22] Filed: Sep. 21, 1988

[30] Foreign Application Priority Data

Sep. 22, 1987 [FR] France ............................ 8713057

[51] Int. Cl.$^4$ ............................................. H01L 27/12
[52] U.S. Cl. ................................. 357/4; 357/16; 357/17; 372/45
[58] Field of Search ................ 357/4 SL, 4, 17, 16; 372/45

[56] References Cited

U.S. PATENT DOCUMENTS

| | | | |
|---|---|---|---|
| 3,982,207 | 9/1976 | Dingle | 357/4 SL |
| 4,261,771 | 4/1981 | Dingle | 357/4 SL |
| 4,439,782 | 3/1984 | Holonyak | 357/17 |
| 4,468,850 | 9/1984 | Liau et al. | |
| 4,561,916 | 12/1985 | Akiyama et al. | |
| 4,835,579 | 5/1989 | Ishibashi | 357/16 |

FOREIGN PATENT DOCUMENTS 177903 4/1986 European Pat. Off. .

OTHER PUBLICATIONS

Levine et al., Appl. Phys. Lett. 48(16), 21 Apr. 1986, p. 1083.
IBM Technical Disclosure Bulletin, vol. 22, No. 1, Jun. 1979, p. 401, N.Y.; US; R. Hung, et al.
Electronics Letters, vol. 20, No. 22, Oct. 25, 1984, pp. 916–918, GB; T. Soga, et al.
Patent Abstracts of Japan, vol. 9, No. 266 (E-352)[1989], Oct. 23, 1985.

*Primary Examiner*—Martin H. Edlow
*Attorney, Agent, or Firm*—Oblon, Spivak, McClelland, Maier & Neustadt

[57] ABSTRACT

Disclosed is an optoelectronic device implanted on a silicon substrate and comprising, in particular, on this substrate, a set of matching layers on which there is made a first confinement layer based on indium phosphide, an active layer based on $Ga_x In_{1-x} As_{1-y}$ and a second active layer of indium phosphide.

12 Claims, 2 Drawing Sheets

FIG_1
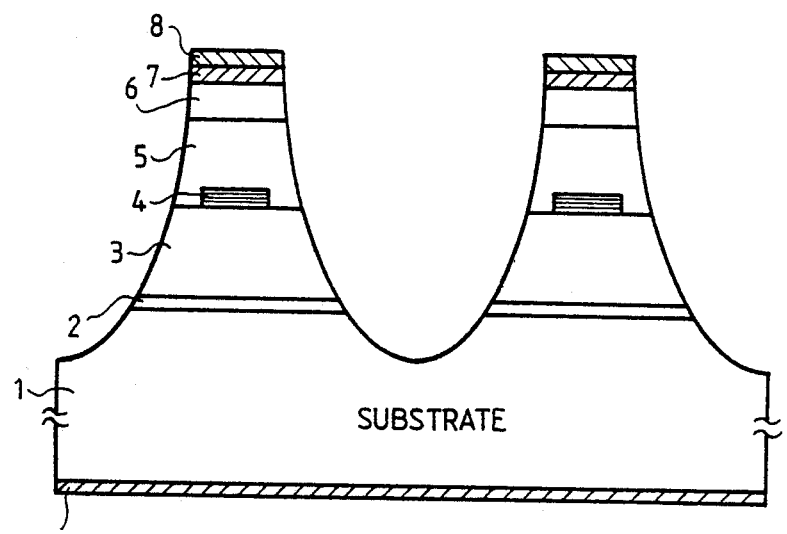
FIG_2
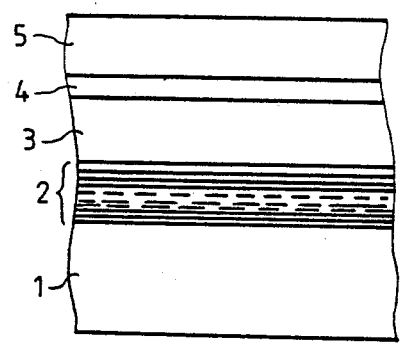

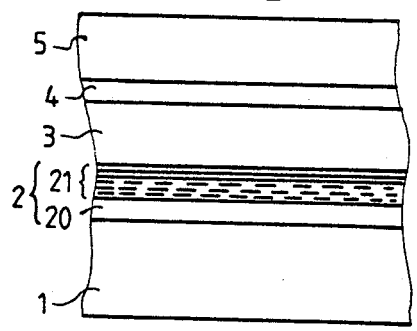
FIG_3
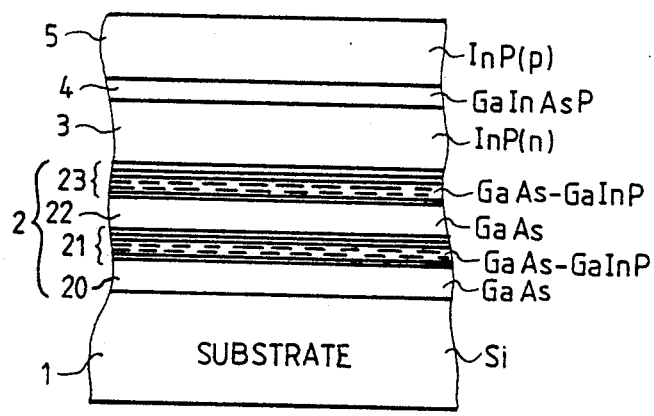
FIG_4
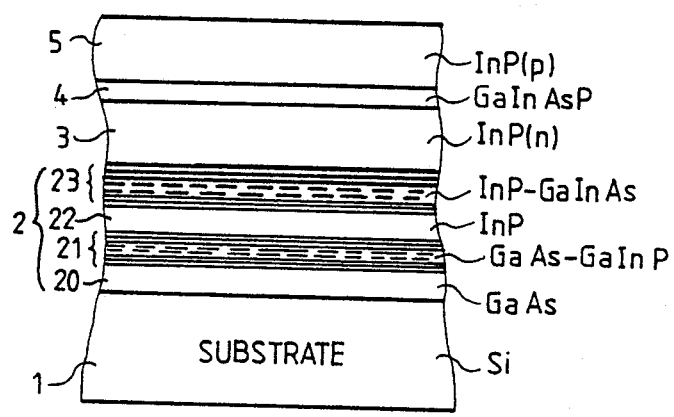
FIG_5

GROUP III-V COMPOUND BASED OPTOELECTRONIC DEVICE ON SILICON SUBSTRATE

BACKGROUND OF THE INVENTION

1. Field of the Invention

The invention concerns an optoelectronic device based on group III-V compounds on a silicon substrate, especially a device based on $Ga_x In_{1-x} As_y P_{1-y}/InP$, made on a crystalline silicon substrate.

2. Description of the Prior Art

Optoelectronic devices, based on a quaternary compound of the $Ga_x In_{1-x} As_y P_{1-y}$ type, with a lattice parameter adapted to that of indium phosphide (InP), have become very important in the optoelectronic materials industry because of their wavelengths and high level of photoluminescence.

Devices of this type have been made on indium phosphate (InP) based substrates. However, substrates made of indium phosphate have the disadvantage of being very costly, of having dislocations, of being mechanically brittle and of having poor thermal conduction.

Moreover, these optoelectronic devices raise problems of thermal dissipation and they should be implanted in substrates providing efficient thermal conduction.

This is why the invention provides for the making of devices of this type on a crystalline silicon substrate, in resolving the problems of lattice mismatching between silicon materials and indium phosphide (InP). For, silicon is now inexpensive and has good thermal and mechanical characteristics.

The optoelectronic device of the invention can be applied especially in long-distance telecommunications.

SUMMARY OF THE INVENTION

The invention therefore concerns an optoelectronic device comprising at least the following elements stacked on one another:
  a substrate made of crystalline silicon with a defined lattice parameter;
  a set of matching layers deposited successively on a surface of the substrate;
  a first confinement layer made of a material containing at least indium and phosphorus elements and having a second defined lattice parameter;;
  an active layer made of material containing at least elements of gallium, indium, arsenic and phosphorus and with a composition of the $Ga_x In_{1-x} As_{1-y} P_y$ type with y ranging between 0 and 1;
  a second confinement layer;
  the set of matching layers comprising at least one layer of a material comprising especially elements of gallium and arsenic and having a lattice parameter which differs little from the first lattice parameter of the substrate, and providing lattice matching of the first confinement layer with the substrate.

BRIEF DESCRIPTION OF THE DRAWINGS

The various objects and characteristics of the invention will appear more clearly from the following description which is made by way of example, with reference to the appended figures, of which:

FIG. 1 is an embodiment of an optoelectronic device according to the invention;

FIG. 2 shows a detailed embodiment of a matching network according to the invention;

FIG. 3 shows another embodiment of a matching network according to the invention comprising a buffer layer;

FIGS. 4 and 5 show two embodiments of the matching network according to the invention, comprising two buffer layers.

DETAILED DESCRIPTION OF THE INVENTION

FIG. 1 shows two optoelectronic devices according to the invention made at the same time on the same substrate.

The optoelectronic device according to the invention provides for associating the mechanical, electronic and thermal qualities of silicon with the optoelectronic or microwave properties of components of the group III-V elements in the periodic classification of elements.

According to the invention, the device as shown in FIG. 1 is made so as to be based on:

GaInAsP/InP

The device shown can be used to resolve the problems of dislocation that might exist between III-V compounds and silicon.

Thus, in FIG. 1, the following are seen successively on a crystalline silicon substrate 1:
  at least one matching layer or a set of matching layers 2 which may comprise, in a simplified way, a layer of gallium arsenide (GaAs);
  a first confinement layer 3 of n type doped indium phosphide (InP);
  a active layer 4 with a general composition:

$Ga_x In_{1-x} As_y P_{1-y}$
  with x ranging between 0 and 1
  and y ranging between 0 and 1
  a second confinement layer 5 of p type doped indium phosphide (InP);
  a contact layer 6 based on p type doped indium gallium arsenide (GaInAs);
  an electrical contact layer 7 made of platinum for example;
  a metallic layer 8, made of gold for example, enabling good electrical contact with external circuits, with another metallic layer 9 of the same nature, deposited directly on the substrate, giving the optoelectronic device another electrical contact.

The device of the invention made with a layer of gallium arsenide (GaAs), instead of the set of matching layers 2, revealed that the dislocations between a silicon substrate and a component made with III-V compounds of the periodic classification of elements (such as GaInAsP/InP) were significantly attenuated.

However, according to the invention, it is also provided that all the matching layers 2 will be made more completely, so as to obtain a more efficient matching of the optoelectronic component with the silicon substrate and to attenuate dislocation lines that might exist.

FIG. 2 shows an optoelectronic component similar to that of FIG. 1 wherein all the matching layers 2 are made in the form of a superlattice, consisting, for example, of an alternating succession of gallium arsenide (GaAs) layers and indium gallium phosphide (GaInP) layers. Each layer has a thickness ranging between 10 and 50 angstroms. The number of layers then ranges from 10 to 100.

FIG. 3 shows an optoelectronic device according to the invention comprising, on the crystalline silicon substrate 1, a buffer layer 20 made of a material with a lattice parameter which hardly differs from the lattice parameter of crystalline silicon. For example, the buffer layer 20 will be made of gallium arsenide(GaAs). On the buffer layer 20 there is made a matching superlattice 21 with alternating layers of gallium arsenide (GaAs) and indium gallium phosphide (GaInP) The buffer layer 20 and the superlattice 21 constitute the set of matching layers 2 on which there are the first confinement layer 3, the active layer 4 and the second confinement layer 5.

For example, the buffer layer 20 has a thickness of 10 to 500 angstroms, the layers of the superlattice 21 each have a layer of 10 to 50 angstroms. The number of layers of the superlattice 21 is greater than 10 and, in practice, ranges between 10 and 50.

FIG. 4 represents an improved embodiment of the device of the invention. It comprises, on the substrate 1, a first buffer layer 20, a first matching superlattice 21, a second buffer layer 22, a second matching superlattice 23 and the optoelectronic component, itself consisting of confinement layers 3, 5 and the active layer 4. The buffer layers 20, 22 and the matching superlattices 21, 23, constitute the set of matching layers 2.

As above, the buffer layers 20, 22 and the matching superlattices 21, 23, are made of materials which enable matching between the confinement layer 3 and the silicon layer 1.

For example, the optoelectronic component of FIG. 4 is made up as follows:
- a substrate 1 made of crystalline silicon material;
- a buffer layer 20 made of a gallium arsenide (GaAs) based material, with thickness of more than 10 angstroms and preferably ranging between 10 and 500 angstroms;
- a matching superlattice 21 consisting, alternately, of layers based on gallium arsenide (GaAs) and layers based on indium gallium phosphide (GaInP), the thickness of each layer being greater than 10 angstroms and preferably ranging from 10 to 50 angstroms. In the layers of GaInP, the relative composition of gallium and indium will be 50%–50% ($Ga_{0.5}In_{0.5}P$). Furthermore, the number of layers will be greater than five and the device will give good results with a number of layers equal to 10. Finally, the layer of this superlattice closest to the buffer layer 20 will be gallium arsenide based while the layer closest to the buffer layer 22 will be based on indium gallium phosphide;
- a buffer layer 22 made of a gallium arsenide (GaAs) based material with a thickness of more than 10 angstroms, preferably between 10 and 500 angstroms;
- a matching superlattice 23 made in a way similar to the matching superlattice 21;
- a confinement layer 3 based on n doped indium phosphide with a thickness of about 2 micrometers;
- an active layer 4 with a basic composition:

$$Ga_x In_{1-x} As_y P_{1-y}$$

with x and y each ranging between 0 and 1 and with a thickness of about 2000 angstroms;
- a p doped indium phosphide based confinement layer with a thickness of about 500 angstroms.

FIG. 5 shows another embodiment comprising, on the substrate 1, a first buffer layer 20, a first superlattice 21, a second buffer layer 22 and a second superlattice 23. This embodiment differs from that of FIG. 4 through the constitution of the second buffer layer 22 and the second superlattice 23.

The second buffer layer 22 is made of a material similar to that of the first confinement layer 3 and is, for example, indium phosphide (InP) based. The thickness is greater than 10 angstroms and ranges, for example, between 10 and 500 angstroms.

The superlattice 23 consists alternately of indium phosphide layers (InP) and indium gallium arsenide based layers. In the layers of GaInAs, the proportions of gallium and indium will be, for example, 47% of gallium and 53% of indium ($Ga_{0.47}In_{0.53}As$). The thickness of each layer of the superlattice 23 is greater than 10 angstroms and the number of layers is equal, for example, to 10.

The various devices thus described will be made by a known method of epitaxy such as metalorganic chemical vapor deposition (MOCVD) epitaxy or molecular beam electronic epitaxy or by any combination of these two methods The invention can thus be used to obtain a buried heterostructure (BH) laser on a silicon substrate with a double heterostructure working at a wavelength of 1.5 um.

A laser made in this way enabled observation of infrared electroluminescence in continuous mode with a spike at 200 mA. Operation for 24 hours in continuous mode at 120 mA without any loss in light intensity has also been observed.

It is obvious that the above description has been made only by way of a non-restrictive example. Other alternatives can be envisaged without going beyond the scope of the invention. The numerical examples, especially, and the examples of materials used have been given purely to illustrate the description.

What is claimed is:

1. An optoelectronic device comprising at least the following, stacked on one another:
   - a substrate made of crystalline silicon with a defined lattice parameter;
   - a set of matching layers deposited successively on a surface of the substrate;
   - a first confinement layer made of a material containing at least indium and phosphorus elements and having a second defined lattice parameter;;
   - an active layer made of material containing at least elements of gallium, indium, arsenic and phosphorus and with a composition of the $Ga_x In_{1-x} As_{1-y} P_y$ type with y ranging between 0 and 1;
   - a second confinement layer;
   - the set of matching layers comprising at least one layer of a material comprising especially elements of gallium and arsenic and having a lattice parameter which differs little from the first lattice parameter of the substrate, and providing lattice matching of the first confinement layer with the substrate.

2. An optoelectronic device according to claim 1 wherein the set of matching layers comprises firstly, on the substrate 1 side, at least one layer of a material containing especially elements of gallium and arsenic and having a lattice parameter which differs little from the first lattice parameter of the substrate and, secondly, on the first confinement layer side, at least one layer of a material with a nature similar to that of the first confinement layer and having a lattice parameter adapted to that of the first confinement layer.

3. A device according to claim 1 wherein the set of matching layers is a matching lattice comprising, alternately, layers containing elements of arsenic and gallium and layers containing elements of indium and phosphorus, 4. A device according to claim 1 wherein the set of matching layers comprises at least one first buffer layer made of an arsenic and gallium based material located on the substrate and at least one first matching superlattice located on the buffer layer and comprising, alternately, layers containing elements of arsenic and gallium and layers containing elements of indium and phosphorus.

5. A device according to claim 4 wherein all the matching layers comprise, stacked on the first matching lattice, a second buffer layer and a second matching superlattice.

6. A device according to claim 5 wherein the second buffer layer is a gallium and arsenic based material.

7. A device according to claim 5 wherein the second buffer layer is an indium and phosphorus based material.

8. A device according to claim 6 wherein:
the first matching superlattice comprises, alternately, layers of arsenic and gallium based material and layers of gallium, indium and phosphorus based material;
the second matching superlattice comprises, alternately, layers of arsenic and gallium based material and layers of gallium, indium and phosphorus based material.

9. A device according to claim 7 wherein:
the first matching superlattice comprises, alternately, layers of arsenic and gallium based material and layers of gallium, indium and phosphorus based material;
the second matching superlattice comprises, alternately, layers of indium and phosphorus based material and layers of gallium, indium and arsenic based material.

10. A device according to claim 1 wherein the set of matching layers comprises alternate layers, between 10 and 50 angstroms thick, of firstly, an arsenic and gallium based material and, secondly, a material with a lattice parameter that is substantially matched with that of the first confinement layer, the number of layers of the set of matching layers ranging between 10 and 100.

11. A device according to claim 4 wherein:
the thickness of the first buffer layer is greater than 10 angstroms;
the first matching superlattice comprises at least five layers, each with a thickness of more than 10 angstroms.

12. A device according to claim 5 wherein:
the thickness of the second buffer layer is greater than 10 angstroms;
the second matching superlattice has at least five layers, each with a thickness of more than 10 angstroms.

* * * * *